United States Patent [19]

Hollyday et al.

[11] 4,222,626

[45] Sep. 16, 1980

[54] FILTERED DIP HEADER ASSEMBLY

[75] Inventors: Robert D. Hollyday, Hershey; Douglas W. Glover, Harrisburg, both of Pa.

[73] Assignee: AMP Incorporated, Harrisburg, Pa.

[21] Appl. No.: 869,874

[22] Filed: Jan. 16, 1978

[51] Int. Cl.[3] .......................... H05K 1/04; H03H 7/00

[52] U.S. Cl. ................................. 339/147 R; 333/182

[58] Field of Search ................ 339/147 R, 17 CF, 14, 339/91 R, 143, 147; 333/182, 185

[56] References Cited

U.S. PATENT DOCUMENTS

| | | | |
|---|---|---|---|
| 3,329,911 | 7/1967 | Schlicke et al. | 339/147 UX |
| 3,467,944 | 9/1969 | Hammell et al. | 339/17 L X |
| 3,663,929 | 5/1972 | Miertschin | 339/147 R X |
| 3,702,422 | 11/1972 | Schor | 333/185 X |
| 3,792,412 | 2/1974 | Madden | 339/17 C |
| 3,914,001 | 10/1975 | Nelson et al. | 339/14 R |
| 3,961,294 | 6/1976 | Hollyday | 339/147 R X |
| 4,053,199 | 10/1977 | Hollyday et al. | 339/91 R |

*Primary Examiner*—Joseph H. McGlynn
*Assistant Examiner*—John S. Brown
*Attorney, Agent, or Firm*—Russell J. Egan

[57] ABSTRACT

A dip header assembly is disclosed having filter means for filtering out EMF/RFI interference in a dip header application.

3 Claims, 2 Drawing Figures

FILTERED DIP HEADER ASSEMBLY

BACKGROUND OF THE INVENTION

1. The Field of the Invention

The present invention relates to a dip header assembly and in particular to a dip header assembly including EMI/RFI filtering means.

2. The Prior Art

The present invention is related to connectors of the type known as dip headers. An example of the known prior art can be found in U.S. Pat. No. 3,467,944 showing such a header. There are often times when it is desirable to include filtering on one or more terminals of such dip header assemblies in order to provide the necessary modified electrical characteristics to accomplish the desired circuitry results.

SUMMARY OF THE INVENTION

The present invention relates to a dip header assembly having a substantially rectangular housing including a substantially rectangular recess therein. A plurality of terminals are mounted in the housing in a spaced and aligned configuration with each terminal having a pin portion extending through the base of the housing and a socket portion exposed from the recessed area. At least some of the terminals are provided with filter means. Each filtered terminal is inserted through and electrically connected to the internal diameter of a respective sleeve filter which in turn is electrically connected to ground on the outside diameter. The recess is substantially filled with a potting material to secure the terminals in position.

It is therefore an object of the present invention to provide a means for filtering out EMI/RFI interference in dip header applications.

It is a further object of the present invention to provide multi-circuit direct interface between printed circuit boards and interconnecting devices, such as dip headers, integrated circuit device connectors, and the like, with a filtered interface.

It is a further object of the present invention to produce a filtered dip header assembly which can be readily and economically produced.

The foregoing objects and other advantages of the present invention will become apparent to those skilled in the art from the following detailed description taken with reference to the accompanying drawings.

DETAILED DESCRIPTION OF THE PREFERRED EMBODIMENT

Figure 1:
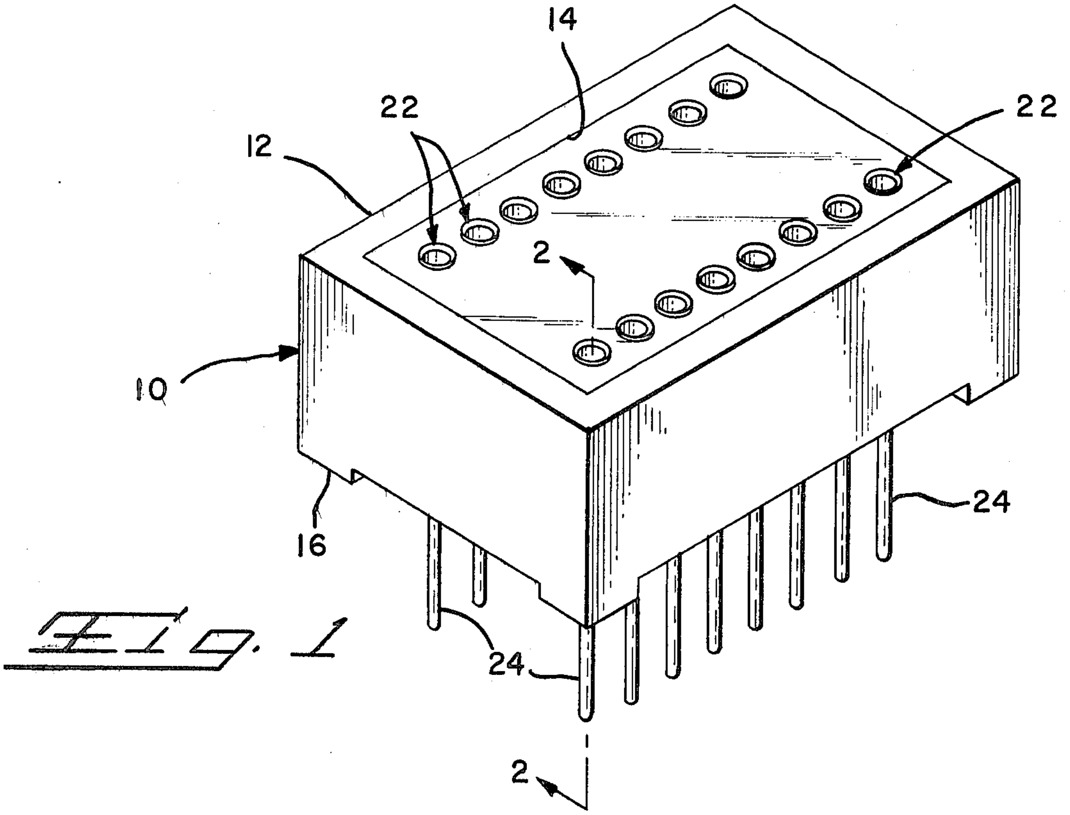
FIG. 1 is a perspective view of the subject filtered dip header assembly.
Figure 2:
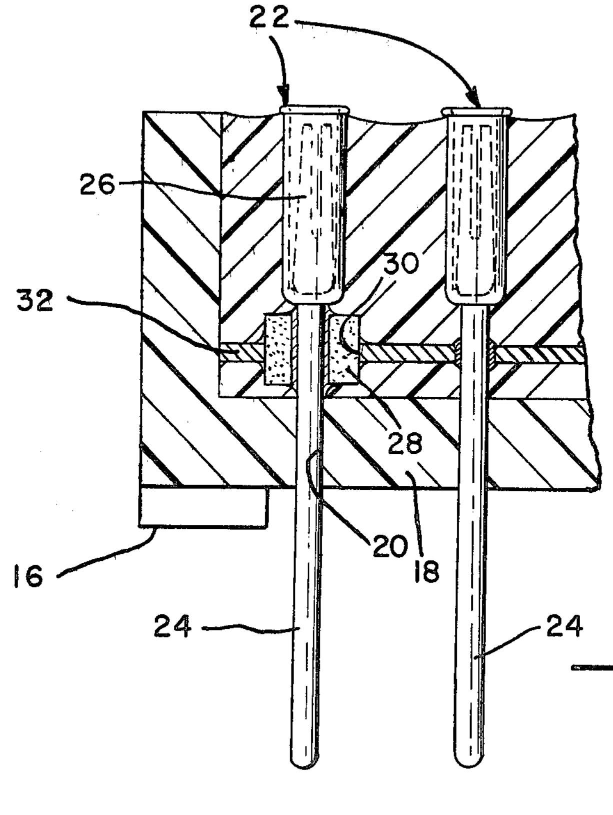
FIG. 2 is a vertical section taken along line 2—2 of FIG. 1 showing a filtered terminal.

The subject dip header assembly 10 includes a housing 12 of rigid insulative material having a substantially rectangular shape defining an elongated blind cavity 14 therein. The housing may also be provided with a plurality of set-offs or feet 16, as desired. The base 18 of the housing 12 includes a plurality of terminal passages 20. A like plurality of terminals 22 are provided each including a pin portion 24, and a socket portion 26. Each terminal has its pin portion 24 extending through a respective terminal passage 20 in the base 18. At least some of the terminals also have their pin portions 24 passing through and electrically connected to the inner diameter of a sleeve filter 28, which, in turn, passes through an aperture 30 in a ground plane 32, with the outer diameter of the filter sleeve electrically connected to the ground plane. The cavity 14 surrounding the terminals 26 is subsequently filled with a potting material 34 or a prefarmed block of insulation material.

The terminals 22 may be of any well known configuration, such as the terminal shown in U.S. Pat. Nos. 3,440,597 and 3,467,944. The filter 28 is also of a well known configuration, as defined by U.S. Pat. No. Reissue 29,258.

Thus, the subject filtered dip header assembly consists of a plurality of circuits, each formed by a pin and socket terminal in combination with a filter sleeve and a ground plane and a means of packaging the ground plane and circuits to form an integral unit. One or more of the terminals can be directly grounded to the ground plane, without filtering, so that the ground may be grounded to a printed circuit board ground plane (not shown), with the remaining circuits being filtered.

The present invention may be subject to many modifications and changes without departing from the spirit or essential characteristics thereof. The present embodiment should therefore be considered in all respects as illustrative and not restrictive of the scope of the invention.

What is claimed is:

1. A filtered dip header assembly comprising:
- a unitary housing of insulating material having an base, spaced sidewalls and endwalls defining a single elongated cavity therebetween;
- a plurality of terminal passages in said base in a patterned array;
- a conductive ground plane positioned in said cavity spaced from said base and having therein a like plurality of apertures, each said aperture being aligned with a respective passage in said base;
- a cylindrical filter mounted in at least one of said apertures and electrically connected to said ground plane by its outer diameter;
- a like plurality of terminals each mounted in a respective one of said apertures and said passages, each said terminal having a pin portion extending through said passage and a socket portion opening in said cavity, those terminals passing through a respective cylindrical filter being electrically connected to the inner diameter thereof;
- at least one of said terminals being directly electrically connected to said ground plane; and
- insulation material substantially filling said cavity around the socket portions of said terminals.

2. A filtered dip header assembly according to claim 1 wherein:
said insulation material is potting material.

3. A filtered dip header assembly according to claim 1 wherein:
said insulation material is a performed member inserted into said cavity.

* * * * *